(12) United States Patent
Lin et al.

(10) Patent No.: US 9,691,872 B2
(45) Date of Patent: Jun. 27, 2017

(54) III-V SEMICONDUCTOR DEVICE WITH INTERFACIAL LAYER

(71) Applicants: IMEC VZW, Leuven (BE); Katholieke Universiteit Leuven, KU LEUVEN R&D, Leuven (BE)

(72) Inventors: Han Chung Lin, Leuven (BE); Laura Nyns, Paal (BE); Tsvetan Ivanov, Heverlee (BE); Dennis Van Dorp, Hannut (BE)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 14/341,629

(22) Filed: Jul. 25, 2014

(65) Prior Publication Data

US 2015/0028428 A1    Jan. 29, 2015

(30) Foreign Application Priority Data

Jul. 25, 2013  (EP) .................................... 13177959

(51) Int. Cl.
*H01L 21/02*  (2006.01)
*H01L 29/51*  (2006.01)
*H01L 21/28*  (2006.01)
*H01L 29/20*  (2006.01)

(52) U.S. Cl.
CPC ...... *H01L 29/513* (2013.01); *H01L 21/02192* (2013.01); *H01L 21/28264* (2013.01); *H01L 29/2003* (2013.01); *H01L 29/517* (2013.01); *H01L 21/02172* (2013.01); *H01L 21/02178* (2013.01); *H01L 29/20* (2013.01)

(58) Field of Classification Search
CPC ............... H01L 29/513; H01L 28/2003; H01L 21/02192; H01L 21/02172; H01L 21/02178; H01L 21/022; H01L 21/28264; H01L 29/2003; H01L 29/511; H01L 29/516; H01L 29/517; H01L 21/02; H01L 29/20; H01L 29/51
USPC ...................................................... 257/411
See application file for complete search history.

(56) References Cited

U.S. PATENT DOCUMENTS

| | | | |
|---|---|---|---|
| 6,933,244 B2 | 8/2005 | Goodhue | |
| 7,507,629 B2 | 3/2009 | Lucovsky et al. | |
| 7,759,746 B2 | 7/2010 | Clark | |
| 7,816,737 B2 | 10/2010 | Clark | |
| 7,834,426 B2 | 11/2010 | Zheng et al. | |

(Continued)

FOREIGN PATENT DOCUMENTS

WO     2007/146859 A1   12/2007

OTHER PUBLICATIONS

European Search Report, European Patent Application No. 13177959.7, dated Mar. 28, 2014.

(Continued)

*Primary Examiner* — Thanh T Nguyen
(74) *Attorney, Agent, or Firm* — McDonnell Boehnen Hulbert & Berghoff LLP

(57) ABSTRACT

A semiconductor structure comprises a substrate including a III-V material, and a high-k interfacial layer overlaying the substrate. The interfacial layer includes a rare earth aluminate. The present disclosure also relates to an n-type FET device comprising the same, and a method for manufacturing the same.

17 Claims, 8 Drawing Sheets

(56) References Cited

U.S. PATENT DOCUMENTS

| | | |
|---|---|---|
| 8,227,833 B2 | 7/2012 | Dewey et al. |
| 2006/0157733 A1* | 7/2006 | Lucovsky ......... H01L 21/28194 257/192 |
| 2008/0003752 A1 | 1/2008 | Metz et al. |
| 2011/0147900 A1* | 6/2011 | Adelmann ........ H01L 21/02178 257/632 |
| 2012/0074386 A1 | 3/2012 | Rachmady et al. |

OTHER PUBLICATIONS

Wang, Yanzhen et al., "MOSFET's on InP Substrate With LaAlO3/HfO2 Bilayer of Different LaAlO3 Thickness and Single LaxAl1-xO Layer with Different La Doping Level", ECS Transactions, vol. 50, No. 4, Mar. 15, 2013, pp. 151-156.

Zhao, H. et al., "HfO2-Based In0.53Ga0.47As MOSFETs (EOT=10A) Using Various Interfacial Dielectric Layers", Device Research Conference, Piscataway, NJ, USA, Jun. 22, 2009, pp. 89-90.

Huang, J. et al., "InGaAs MOSFET Performance and Reliability Improvement by Simultaneous Reduction of Oxide and Interface Charge in ALD (La)AlOx/ZrO2 Gate Stack", Electron Device Meeting (IEDM), Piscataway, NJ, USA, Dec. 7, 2009, pp. 1-4.

Shiu, K. H. et al., "1 nm Equivalent Oxide Thickness in Ga2O3(Gd2O3)/In0.2Ga0.8As Metal-Oxide-Semiconductor Capacitors", Applied Physics Letters, vol. 92, No. 17, Apr. 30, 2008, pp. 172904-1-172904-3.

Johnson, J.W. et al., "SiO2/Gd2O3/GaN Metal Oxide Semiconductor Field Effect Transistors", Journal of the Electrochemical Society, vol. 148, No. 6, 2001, pp. G303-G306.

Rahman, Md. Shahinur et al., "Gate Stack Dielectric Degradation of Rare-Earth Oxides Grown on High Mobility Ge Substrates", Journal of Applied Physics, vol. 112, Nov. 1, 2012, pp. 094501-1-094501-7.

Adelmann, C. et al., "Atomic-Layer Deposition of GdAlOx and GdHfOx Using Gd(iPr-Cp)3", 216th ECS Meeting, Abstract #2035, The Electrochemical Society, 2009, 1 page.

Luo, B. et al., "Improved DC and Power Performance of AlGaN/GaN High Electron Mobility Transistors with Sc2O3 Gate Dielectric or Surface Passivation", Solid-State Electronics, vol. 47, Apr. 1, 2003, pp. 1781-1786.

Leskelia, Markku et al., "Rare-Earth Oxide Thin Films as Gate Oxides in MOSFET Transistors", Journal of Solid State Chemistry, vol. 171, 2003, pp. 170-174.

Polyakov, A. Y. et al., "Effects of Sc2O3 Surface Passivation on Deep Level Spectra of AlGaN/GaN High Electron Mobility Transistors", Journal of the Electrochemical Society, vol. 151, No. 8, Jul. 9, 2004, pp. G497-G501.

Dimoulas, Athanasios, "Rare Earth Oxides Grown by Molecular Beam Epitaxy for Ultimate Scaling", Rare Earth Oxide Thin Films, Topics in Applied Physics, vol. 106, 2007, pp. 379-390.

Cho, Hyun et al., "Influence of Gate Oxide Thickness on Sc2O3/GaN MOSFETs", Solid State Electronics, vol. 47, Mar. 12, 2003, pp. 1757-1761.

\* cited by examiner

III-V SEMICONDUCTOR DEVICE WITH INTERFACIAL LAYER

CROSS-REFERENCE TO RELATED APPLICATION

This application claims priority to European Patent Application No. 13177959.7 filed on Jul. 25, 2013, the contents of which are hereby incorporated by reference.

TECHNICAL FIELD OF THE DISCLOSURE

The present disclosure relates to the field of semiconductor structures for use in III-V MOS devices, and more specifically to gate stacks for n-FETs.

BACKGROUND OF THE DISCLOSURE

The constant drive toward miniaturization of semiconductor devices makes low equivalent oxide thickness dielectrics particularly desirable. The field of III-V MOS devices is no exception. However, when the equivalent oxide thickness is lowered, the tunnelling leakage current through the dielectric tends to get higher.

To tackle this problem, high-k dielectrics have been used. However, high-k dielectrics have a small bandgap, which can also contribute to high tunnelling leakage current. Furthermore, the decrease in equivalent oxide thickness should not be accompanied by a decrease in charge mobility in the III-V substrate. Indeed, this mobility may be particularly important in Field Effect Transistors.

US 2006/0054937 proposed addressing these issues by inserting between the substrate and the primary dielectric layer an oxide layer including a group III element from the substrate, and by further inserting between the oxide layer and the primary dielectric layer an interfacial dielectric layer. The interfacial dielectric layer includes $HfO_2$, $ZrO_2$, a zirconium silicate alloy, and/or a hafnium silicate alloy. This approach, however, may have the drawback of involving a relatively large number of layers, which multiplies the chances of defects at the interfaces. Also, the obtained equivalent oxide thickness is relatively large.

SUMMARY OF THE DISCLOSURE

For the fabrication of a semiconductor device comprising a III-V substrate and a high-k dielectric, it would be beneficial to achieve the manufacture of a III-V semiconductor structure while achieving a small equivalent oxide thickness for the device, a good charge mobility in a region of the III-V substrate, and/or low levels of tunnelling or leakage current through the high-k dielectric.

In a first aspect of the present disclosure, a semiconductor structure comprises a substrate including a III-V material, and an interfacial layer overlaying the substrate. The interfacial layer may be a high-k interfacial layer and may comprise a rare earth aluminate. This structure may further include a high-k dielectric layer overlaying the interfacial layer.

Embodiments of the semiconductor structures of the present disclosure may present one or more, or even all of the following advantages:

A large offset between a conduction band of the semiconductor substrate and a conduction band of a dielectric, thereby permitting a low leakage current; and/or A low defect density at an interface between the semiconductor substrate and the dielectric, thereby permitting a good mobility in a region of the semiconductor substrate; and/or A high dielectric constant for the interfacial layer or for a stack interfacial layer/high-k dielectric layer, thereby permitting a good capacitance and a low leakage current.

In an embodiment, the substrate comprising a III-V material may have a top surface that includes the III-V material. In this example, the high-k interfacial layer overlaying the substrate will be in direct physical contact with the III-V material.

In an embodiment, the substrate comprising a III-V material may be made up entirely from a III-V material.

As used herein and unless provided otherwise, the term "III-V material" relates to a material comprising or made of a chemical compound with at least one group III (IUPAC group 13) element and at least one group V (IUPAC group 15) element. This includes binary compounds but also higher order compounds such as ternary compounds. It also includes mixtures of such compounds.

Amongst the III-V materials, III-N materials (e.g. GaN) may be less preferred. A reason for this is their relatively large bandgaps (>3 eV) that may make such materials less suitable for the fabrication of FETs.

In an embodiment of the first aspect, the III-V material may be selected from InP, $In_zGa_{1-x}As$, and $Al_zGa_{1-z}As$, wherein z may be from 0 to 1. These III-V materials typically show a good charge mobility.

In embodiments, z may be from 0.1 to 1. This may be advantageous because it can help to improve charge mobility.

In embodiments, z may be from 0.3 to 1. This may be advantageous because larger z values tend to lower the conduction band minimum energy level for the III-V material, thereby helping to increase the conduction band offset between the III-V material and the high-k dielectric layer if present. This in turn may help to reduce the occurrence of leakage current.

Further, the use of a rare earth aluminate for the interfacial layer may be particularly advantageous because it helps to provide a low defect density at the interface with an overlaying substrate comprising a III-V material. This defect density is generally lower than when pure aluminium oxide is overlaying such a substrate. Furthermore, rare earth aluminates are generally very high-k materials (they have a higher k than pure aluminium oxide, for instance).

In an embodiment, the high-k interfacial layer may be in direct physical contact with the III-V material.

In an embodiment, the high-k interfacial layer may be made up entirely of a rare earth aluminate.

As used herein and unless otherwise specified, the term "high-k" relates to a material exhibiting a permittivity that exceeds the permittivity of silicon dioxide (k=3.9). Thus, the term "high-k" relates to a relative permittivity of about 4 or more unless otherwise specified.

Rare earth elements include the following elements Sc, Y, La, Ce, Pr, Nd, Pm, Sm, Eu, Gd, Tb, Dy, Ho, Er, Tm, Yb, and Lu.

Rare earth aluminates have the following general formula: $RE_xAl_yO_3$, wherein RE is one or more rare earth elements (typically a single rare earth element), and wherein x+y=2. In various examples, x may be from 0.1 to 1.9, or from 0.4 to 1.6. If more than one rare earth is present, x is the sum of the contributions $(x_1, x_2, \ldots)$ from each rare earth element.

A semiconductor structure comprising only the substrate and the interfacial layer is typically an intermediate structure that may be suited for being overlaid by a high-k dielectric layer.

In an embodiment of the first aspect, the semiconductor structure may further comprise a high-k dielectric layer overlying the interfacial layer. This structure can be a core structure of several device types and in particular of Field Effect Transistors, wherein a portion of the substrate may serve as a channel and the high-k dielectric layer may serve as a gate dielectric on which a gate electrode can be deposited.

Typically, the chemical nature of the overlaying high-k dielectric layer is different from the chemical nature of the interfacial layer. However, this is not required and, in some embodiments, the chemical nature of the interfacial layer and the chemical nature of the high-k dielectric layer may be the same. In some embodiments, an interfacial layer having a relatively large thickness of from 1 to 4 nm could fulfil both functions and serve as both an interfacial layer and a high-k dielectric layer. Typically, the overlaying high-k dielectric layer does not comprise a rare earth aluminate. This may be beneficial because rare earth aluminates may have a lower k-value than other high-k dielectric materials (such as $HfO_2$). This may also be beneficial because some rare earth aluminates tend to be rather hygroscopic and it may then be preferable to cover the top surface of the interfacial layer with a high-k dielectric material, other than a rare earth aluminate, to protect the surface from water.

In an embodiment of the first aspect, the high-k dielectric layer may have a higher k-value than the interfacial layer.

In an embodiment of the first aspect, the rare earth aluminate may be selected from $Gd_xAl_yO_3$, $Sc_xAl_yO_3$, and $La_xAl_yO_3$, wherein x may be from 0.4 to 1.6, from 0.4 to 1.5, or from 0.4 to 1.4, and wherein x+y=2.

Rare earth aluminates in general and the three above compounds in particular may be advantageous because they facilitate decreases in interface defect density between the III-V substrate and the dielectric.

$Gd_xAl_yO_3$ may be advantageous because it has a relatively high k-value (e.g., about 16 when x=y) permitting a low equivalent oxide thickness.

$Sc_xAl_yO_3$ may be advantageous because it has a low hygroscopy. This permits the use of water in the process for depositing a subsequent high-k dielectric layer. Since such deposition may be performed via Atomic Layer Deposition (ALD), the use of $H_2O$ as the oxidant has the potential advantage of avoiding re-oxidation of the rare earth aluminate during the subsequent high-k dielectric layer deposition. In an embodiment of the first aspect, x may be from 0.4 to 1.0. This is sometimes advantageous because values above 1.0 typically provide less desirable insulating properties and lower band-gap than x values at 1.0 or below. However, x values higher than 1.0 typically provide a better interface than x values at or below 1.0. A range of x values from 1.0 to 1.6 may therefore be advantageous for use in high performance devices that can accommodate higher current leakage or for very small equivalent oxide thickness where the charge mobility is more crucial than the amount of leakage. Higher x values generally increase the k value of the oxides, hence achieving smaller equivalent oxide thickness. An example of a high performance device is an InGaAs channel MOSFET with high Indium content (e.g. 70%). Higher Indium content gives rise to higher drive current and transconductance while the device can tolerate higher gate leakage.

In an embodiment of the first aspect, x may be from 1.0 to 1.6 while the III-V material is $In_zGa_{1-z}As$, and wherein z is from 0.6 to 0.9.

In an embodiment of the first aspect, when the semiconductor structure further comprises a high-k dielectric layer, the equivalent oxide thickness (EOT) of the stack of the high-k interfacial layer and the high-k dielectric layer may be below 1 nm. This EOT may be calculated as follows:

$$EOT = k_{SiO2}(t_{int}/k_{int} + t/k),$$

wherein $k_{SiO2}$ is the k value of $SiO_2$ (e.g., 3.9), $t_{int}$ is the thickness of the interfacial layer, t is the thickness of the high-k dielectric material, $k_{int}$ is the k value of the interfacial layer, and k is the k value of the high-k dielectric material.

In an embodiment of the first aspect, the high-k interfacial layer may comprise $Gd_xAl_yO_3$, $Sc_xAl_yO_3$ or $La_xAl_yO_3$, wherein x is at least 1.0. This may be advantageous because lower x values deteriorate the insulating properties and permit higher current leakages, which is generally undesirable. However, lower x values generally improve the quality of the interface by reducing the defect density. This in turn may improve the charge mobility. Therefore, in some embodiments, it may be advantageous to have an x value of from 0.4 to 1.0. Generally, below 0.4, the insulating properties are only good enough for few applications.

In an embodiment of the first aspect, the high-k interfacial layer may comprise $Gd_xAl_yO_3$, wherein x is at least 1.0. This may be advantageous because in the case of $Gd_xAl_yO_3$, the increase in interface quality becomes low or even marginal below 1.0.

In an embodiment of the first aspect, the high-k interfacial layer may comprise $Sc_xAl_yO_3$, wherein x is at most 1.0. This may be advantageous because, in contrast to $Gd_xAl_yO_3$, the increase in interface quality below 1.0 may be significant for $Sc_xAl_yO_3$. Furthermore, the insulating properties generally suffer less than in the case of $Gd_xAl_yO_3$.

In embodiments of the first aspect where a high-k dielectric layer is present, the high-k dielectric layer may for instance be selected from $HfO_2$, $TiO_2$ and $ZnO_2$. These materials may be advantageous due to their very high k values. Although $AlO_2$ could be used as the high-k dielectric layer, it is generally less preferred in view of its lower k value.

In an embodiment of the first aspect, an interface between the substrate and the high-k interfacial layer may have an interface defect density lower than $10^{13}$, lower than $7*10^{12}$, lower than $5*10^{12}$, lower than $3*10^{12}$, lower than $2*10^{12}$, and perhaps even lower than $1.3*10^{12}$ defects/cm$^2$ when measured in the middle of the bandgap of the III-V material. For instance, the middle of the bandgap of InP is 1.34 eV/2=0.67 eV, and the middle of the bandgap of $In_{0.53}Ga_{0.47}As$ is 0.75 eV/2=0.38 eV.

In an embodiment of the first aspect, an interface between the substrate and the high-k interfacial layer may for instance have an interface defect density of from $5*10^{11}$ to $1*10^{13}$ defects/cm$^2$, or from $8*10^{11}$ to $7*10^{12}$ defects/cm$^2$ when measured in the middle of the bandgap of the III-V material.

In an embodiment of the first aspect, an interface between the substrate and the high-k interfacial layer may have an interface defect density lower than $5*10^{12}$, lower than $3*10^{12}$, lower than $1*10^{12}$, lower than $0.9*10^{12}$, lower than $0.6*10^{12}$ and perhaps even lower than $0.3*10^{12}$ defects/cm$^2$ when measured at at least one energy level within the bandgap of the III-V material. The defect density will typically be lowest at the energy level of the conduction band edge of the III-V material but, due to current instrumental limitations and/or to the low thickness of the $Re_x$-$Al_yO_3$ (<5 nm), an accurate Dit value cannot always be determined at the conduction band edge. In an embodiment of the first aspect, an interface between the substrate and the high-k interfacial layer may have an interface defect density of from $5*10^{10}$ to $5.10^{12}$ defects/cm$^2$, or from $8*10^{10}$ to $3*10^{12}$ defects/cm$^2$ when measured at at least one energy level within the bandgap of the III-V material.

This may be advantageous because such a low defect density permits a relatively high charge mobility.

In an embodiment of the first aspect, the high-k interfacial layer may be an incomplete monolayer, a complete monolayer or a multilayer. In embodiments, the thickness of the high-k interfacial layer may be up to 10 nm, up to 6 nm, up to 4 nm, or perhaps even up to 2 nm. For instance, it can be from 0.5 to 2 nm. A thickness within this range may be advantageous as it is thick enough to enable the relatively low defect density. Thicker interfacial layer could be used but it may be preferred to limit the thickness of the interfacial layer so that most of the contribution to the equivalent oxide thickness comes from the high-k dielectric layer, which k value can for instance be higher.

In embodiments of the first aspect where a high-k dielectric layer is present, the high-k dielectric layer may be an incomplete monolayer, a complete monolayer or a multilayer. In embodiments, the thickness of the high-k dielectric layer may be up to 10 nm, up to 6 nm, up to 4 nm, or perhaps up to 2 nm. For instance, it can be from 0.5 to 4 nm. A thickness within this range may be advantageous as it is thick enough to insulate the semiconductor substrate from a gate electrode, when present. Thicker interfacial layers could be used but miniaturization imposes relatively thin dielectric layers. In embodiments, the thickness of the high-k dielectric layer may be from 0.5 to 1.5 times the thickness of the high-k interfacial layer.

In an embodiment of the first aspect, a leakage current below 0.01 A/cm$^2$ may be achieved at 1V.

In an embodiment of the first aspect, a sulphur-comprising compound may be present at the interface between the substrate and the high-k interfacial layer. This sulphur containing compound is preferably inorganic. For instance, the sulphur-comprising compound may be ammonium sulphide. This may have the advantage of lowering the interface defect density (Dit) and/or to prolong the lifetime of the device.

In an embodiment, the high-k interfacial layer has a top surface facing away from the substrate and a bottom surface facing toward the substrate, and the aluminium content at the top surface is higher than at the bottom surface. This can for instance be shown by angle resolved X-ray photoelectron spectroscopy (XPS).

In a second aspect, the present disclosure relates to a FET device, such as a n-type FET device, that includes a semiconductor structure according to any embodiment of the first aspect.

Generally, typically, an FET device according to the second aspect may include a substrate comprising a III-V material. The substrate may include a source, a drain, and a channel region between the source and the drain. The FET device may also include a high-k interfacial layer overlying the substrate, and the interfacial layer may comprise a rare earth aluminate. Further, the FET device may include a high-k dielectric layer overlying the interfacial layer, and a gate electrode overlaying the high-k dielectric layer.

The substrate, the high-k interfacial layer, and the high-k dielectric layer may be configured according to any embodiment of the first aspect.

In embodiments, a sulphur-comprising compound as describe in the first aspect may be present at the interface between the substrate and the high-k interfacial layer.

In a third aspect, the present disclosure relates to a method for manufacturing a semiconductor structure according to the first aspect. In one example, the method includes a) providing a substrate comprising a III-V material, and b) depositing a high-k interfacial layer overlaying the substrate, wherein the interfacial layer comprises a rare earth aluminate.

The method element a) of providing a substrate may comprise treating the substrate in order to remove native oxide on a surface thereof. This treatment can for instance be an acid treatment, such as a HCl treatment.

In an embodiment of the third aspect, the method may further comprise a method element a') of providing a sulphur-comprising compound at the interface between the substrate and the high-k interfacial layer. This method element a') may be performed between method element a) and method element b) by depositing the sulphur-comprising compound onto the substrate. The deposition of the sulphur-comprising compound can be performed in several ways. It can be performed by immerging the substrate in a solution of the sulphur-comprising compound, or it can be performed by exposing the substrate to vapours of the sulphur-comprising compound. Exposing the substrate to vapours of the sulphur-comprising compound can be performed by placing the substrate in the atmosphere of a chamber comprising the sulphur-comprising compound solution and its vapour. It can also be performed by synthesising the sulphur-comprising compound in situ (e.g., by mixing $NH_3$, $H_2S$ and $H_2O$, thereby generating ammonium sulphate) in a chamber containing the substrate.

In an embodiment, in method element a'), the substrate is contacted with the sulphur comprising compound for a time period such that after method element b), the maximum photoluminescence intensity of the semiconductor structure is at least 20%, at least 40%, or at least 50% of the maximum photoluminescence intensity of the bare substrate free of native oxide layer. The time period can vary in function of several parameters including but not limited to whether the state of the sulphur compound (vapour or liquid solution), the pressure of the atmosphere, the temperature, the chemical nature of the sulphur compound, and its concentration in the vapour or liquid.

In an embodiment, the time period could be 5 to 30 minutes if the exposure is to vapour of $(NH_4)_2S$ at 1 atm and at room temperature.

In an embodiment, method element b) may be performed by Atomic Layer Deposition (ALD) or by molecular beam epitaxy (MBE). ALD may be preferred because it is generally a faster process. Furthermore, ALD may permit easier obtaining of uniform and conformal layers, which thickness can be controlled at the atomic level.

Suitable precursors for the synthesis of $RE_xAl_yO_3$ are a RE precursor, an Al precursor, and an O precursor.

Examples of Al precursors are Aluminum tris(2,2,6,6-tetramethyl-3,5-heptanedionate), Triisobutylaluminum, Trimethylaluminum (TMA), and Tris(dimethylamido)aluminum(III). TMA may be preferred.

Examples of Gd precursors are Tris[N,N-Bis(trimethylsilyl)amide]gadolinium(III), Tris(cyclopentadienyl)gadolinium(III), and Tris(tetramethylcyclopentadienyl)gadolinium(III).

Examples of Sc precursors are Tris[N,N-bis(trimethylsilyl)amide]scandium(III), and Tris(cyclopentadienyl)scandium(III).

Examples of La precursors are Lanthanum(III) isopropoxide, Tris[N,N-bis(trimethylsilyl)amide]lanthanum(III), Tris(cyclopentadienyl)lanthanum(III), and Tris(tetramethylcyclopentadienyl)lanthanum(III).

Examples of O precursors are $H_2O$, $O_2$ and $O_3$. $H_2O$ may be preferred.

The method may further comprise a step c) of overlying a high-k dielectric layer on the high-k interfacial layer. The high-k dielectric layer may preferably be deposited via ALD. $HfO_2$, $TiO_2$ and $ZnO_2$ are examples of suitable high-k dielectric layers.

In general, carbon-free precursors may have the advantage of permitting the formation of high-k dielectric layer showing lower current leakage. However, carbon-comprising precursors may have the advantage of requiring lower temperature for deposition than carbon-free precursors, which is general good for the III-V substrate. The III-V substrate tend to suffer at temperatures above 300° C. ALD depositions on a III-V substrate may therefore be performed at or below 300° C.

Examples of Hf precursors are Bis(tert-butylcyclopentadienyl)dimethylhafnium(IV), Bis(methyl-η5-cyclopentadienyl)dimethylhafnium, Bis(methyl-η5-cyclopentadienyl)methoxymethylhafnium, Bis(trimethylsilyl)amidohafnium (IV) chloride, Dimethylbis(cyclopentadienyl)hafnium(IV), Hafnium(IV) tert-butoxide, Hafnium isopropoxide isopropanol adduct, Tetrakis(diethylamido)hafnium(IV), Tetrakis(dimethylamido)hafnium(IV), Hafnium tetrachloride, and Tetrakis(ethylmethylamido)hafnium(IV). Hafnium tetrachloride may have the advantage to be carbon-free, permitting a lower leakage current.

Examples of Ti precursors are Bis(tert-butylcyclopentadienyl)titanium(IV)dichloride, Bis(diethylamido)bis(dimethylamido)titanium(IV), Tetrakis(diethylamido)titanium (IV), Tetrakis(ethylmethylamido)titanium(IV), Titanium (IV)diisopropoxide-bis(2,2,6,6-tetramethyl-3,5-heptanedionate), Titanium(IV) isopropoxide, and Titanium tetrachloride.

Titanium precursors may be advantageous because they permit a better scaling. They however may have the drawback of requiring a relatively high deposition temperature. Titanium tetrachloride may be advantageous because it is carbon-free, permitting a lower leakage current.

Examples of Zn precursors are Bis(pentafluorophenyl) zinc, Bis(2,2,6,6-tetramethyl-3,5-heptanedionato)zinc(II), Diethylzinc, and Diphenylzinc.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The method may further comprise a method element d) of annealing the semiconductor structure after the deposition of the high k dielectric layer. This annealing may be performed in a reductive atmosphere.

For instance, after the ALD deposition, the sample may be transferred in an anneal oven, and an annealing step performed for 5 minutes at 400° C. in a 10% $H_2$ atmosphere.

The method may further comprise a method element e) of depositing a top metal gate on the high-k dielectric layer. For instance, a 80 nm of TiN may deposited as a top metal gate.

The above and other characteristics, features, aspects, examples, and advantages of the present disclosure will become more apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
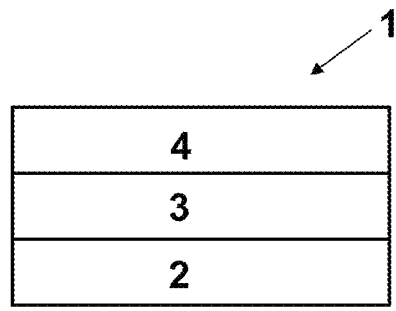
FIG. 1 is a schematic representation of a semiconductor structure according to an embodiment of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments or aspects.

Similarly it should be appreciated that in the description of embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from technical teaching of the disclosure, the disclosure being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

Figure 4:
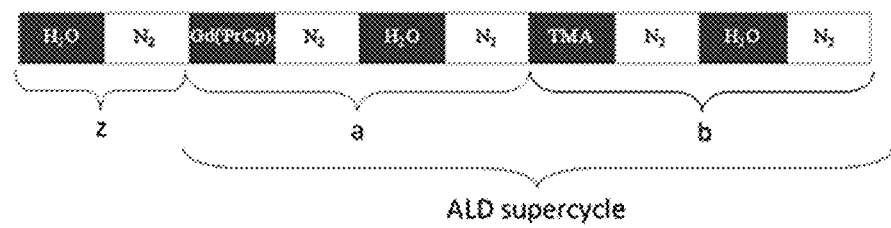
FIG. 4 is a diagram illustrating a method for manufacturing a semiconductor structure according to an embodiment of the present disclosure.

Example 1: Manufacture of a Semiconductor Structure 1 (see FIG. 1) Comprising a $Gd_xAl_yO_3$ Interfacial Layer 3 According to an Embodiment of the Present Disclosure In one example, a 2-inch bulk InP substrate 2 or an InGaAs substrate 2 grown by CVD or MBE on a 2-inch bulk InP substrate is dipped in a 2M HCl solution for 5 minutes in order to remove its native oxide top layer. It is then immersed in a 20 wt % aqueous solution of $(NH_4)_2S$ for 5 minutes. The substrate 2 is then directly transferred into the load lock of an ALD reactor, the pressure is decreased from atmospheric pressure to a few torr, and then it is backfilled with $N_2$ until atmospheric pressure. The substrate is then transferred from the load lock to the ALD chamber. The pressure of the ALD chamber is about 3 Torr. A $Gd_xAl_yO_3$ layer 4 is then deposited at 250° C. by the method illustrated in FIG. 4. First, a water pulse/$N_2$ purge is performed (z) in order to saturate the substrate 2 with hydroxyl groups, second, one or more Gadolinium deposition cycles (a) are performed. A cycle (a) included a Gd precursor (e.g. Gd($^i$P-rCp)$_3$) pulse followed by a $N_2$ purge, followed by an oxidative pulse (typically a water pulse), and followed by a $N_2$ purge. Third, one or more aluminium deposition cycles (b) are performed. A cycle (b) include an aluminium precursor pulse (typically TMA), followed by a $N_2$ purge, followed by an oxidative pulse (typically a water pulse), and followed by a $N_2$ purge. The sum of the one or more Gadolinium deposition cycles (a) plus the one or more Aluminium deposition cycles (b) amounts to one supercycle. The thickness of the $Gd_xAl_yO_3$ layer 3 can be controlled by the number of ALD super cycles while the composition is tuned by the number of cycles (a) and (b).

After the ALD deposition, the sample is transferred in an anneal oven and an annealing step is performed for 5 minutes at 400° C. in a 10% $H_2$ atmosphere. 80 nm of TiN may then deposited as a top metal gate.

Example 2: Manufacture of a Semiconductor Structure 1 Comprising a $Sc_xAl_yO_3$ Interfacial Layer 3 According to an Embodiment of the Present Disclosure The processes of Example 1 may be repeated, but a Sc precursor is used instead of a Gd precursor.

Example 3: Manufacture of a Semiconductor Structure 1 Comprising a $La_xAl_yO_3$ Interfacial Layer 3 According to an Embodiment of the Present Disclosure The processes of Example 1 may be repeated but a La precursor is used instead of a Gd precursor.

Example 4: Influence of the Presence of a Sulphur-Comprising Compound at the Interface Between the Substrate 2 and the High-k Interfacial Layer 3

In one example, 2-inch bulk InP substrates 2 were dipped in a 2M HCl solution for 5 minutes in order to remove their native oxide top layer.

Figure 5:
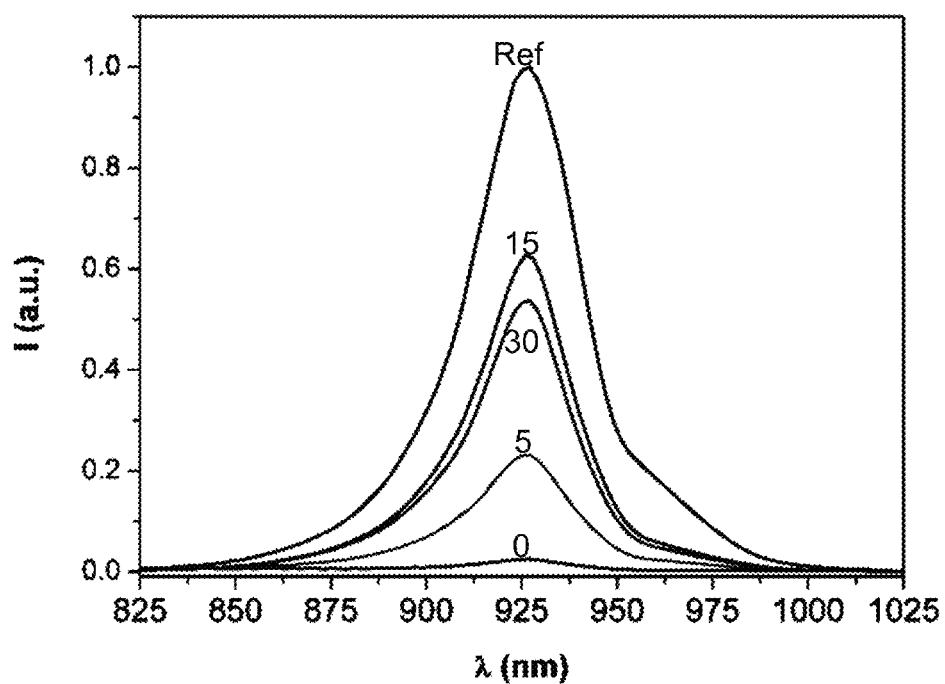
FIG. 5 is a graph of the photoluminescence intensity versus the wavelength for semiconductor structures according to embodiments of the present disclosure and for a bare substrate.

The photoluminescence of one of these substrates 2 (the reference substrate) was then measured and is shown in FIG. 5 (Ref). A high photoluminescence intensity was observed.

The remaining substrates 2 were then either not exposed to $(NH_4)_2S$ vapours or exposed to $(NH_4)_2S$ vapours for a period of from 5 to 30 minutes. In a next process, these remaining substrates 2 were coated by ALD with a 4 nm $Gd_{1.4}Al_{0.6}O_3$ layer 3 via an ALD procedure as described in Example 1, wherein each supercycle comprises four Gd cycles (a) and one Al cycle (b).

Figure 6:
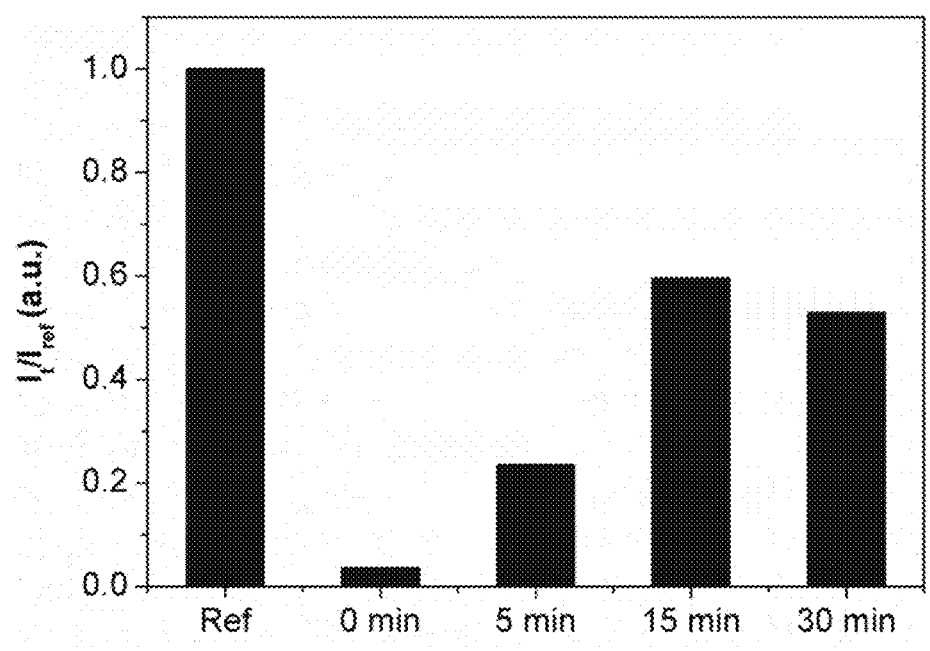
FIG. 6 shows the integrated intensity ratio between the photoluminescence intensity of a $InP/Gd_{1.4}Al_{0.6}O_3$ semiconductor structure according to embodiments of the present disclosure and the photoluminescence intensity of a bare InP substrate for various exposure times to $(NH_4)_2S$ vapour.

The remaining substrate 2 not exposed to $(NH_4)_2S$ vapour saw its PL intensity decreasing by more than one order of magnitude compared to the bare native oxide-free InP substrate (see 0 in FIG. 5 and 0 min in FIG. 6). This indicates a relatively large defect recombination rate at the InP/$Gd_{1.4}Al_{0.6}O_3$ interface. The quality of the interface was significantly improved when the InP wafer 2 was exposed to $(NH_4)_2S$ vapor prior to the high-k interfacial layer 3 deposition. A strong correlation was observed between the PL intensity and the vapour exposure time (see FIGS. 5 and 6). A potential advantage of using a sulphur comprising compound for the interface quality is demonstrated by this experiment. The ratio between the integrated intensity of the InP/$Gd_{1.4}Al_{0.6}O_3$ stack (It) and the integrated intensity of the reference sample prior to passivation (Iref) is shown in FIG. 6. The maximum increase was observed after 15 minutes of vapour exposure. The integrated intensity corresponded to about 60% of the integrated intensity of the reference substrate.

An analogous experiment was then conducted while substituting $Al_2O_3$ for $Gd_{1.4}Al_{0.6}O_3$. Here, no increase in PL intensity was observed after $(NH_4)_2S$ vapour exposure. An $I_t/I_0$ ratio of ~0.1 was observed after 15 minutes of vapour exposure. This provides strong evidence that the combination of a rare earth based aluminate layer 3 and sulphur may be particularly advantageous compared to $Al_2O_3$ and sulphur for achieving a high quality interface.

Figure 7:
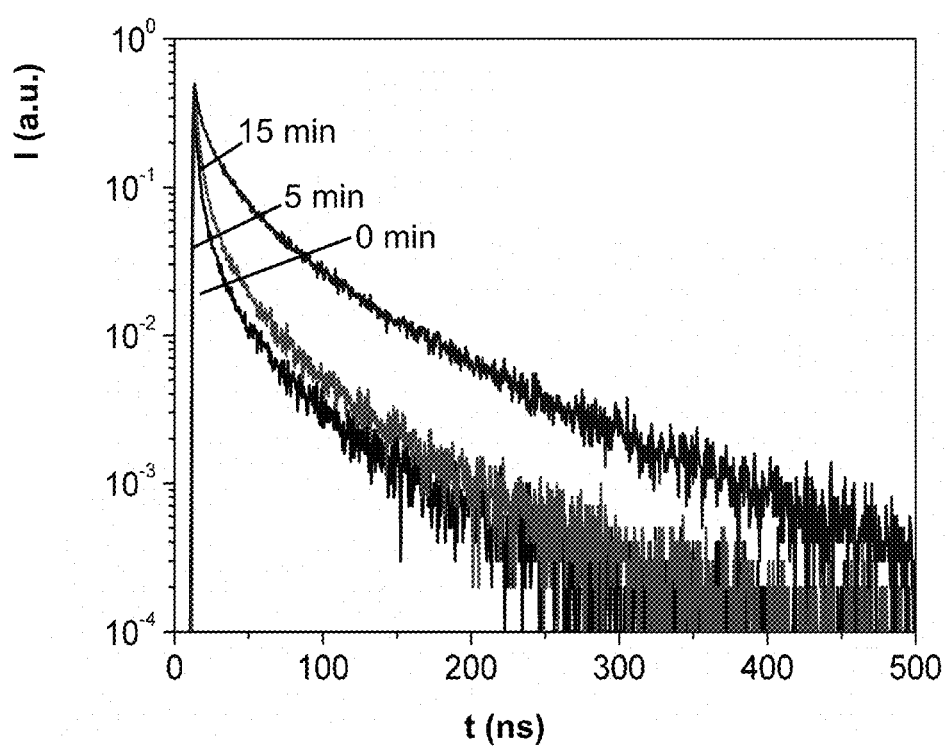
FIG. 7 shows the decay curves for semiconductor structures at different exposure times according to embodiments of the present disclosure.
Figure 8:
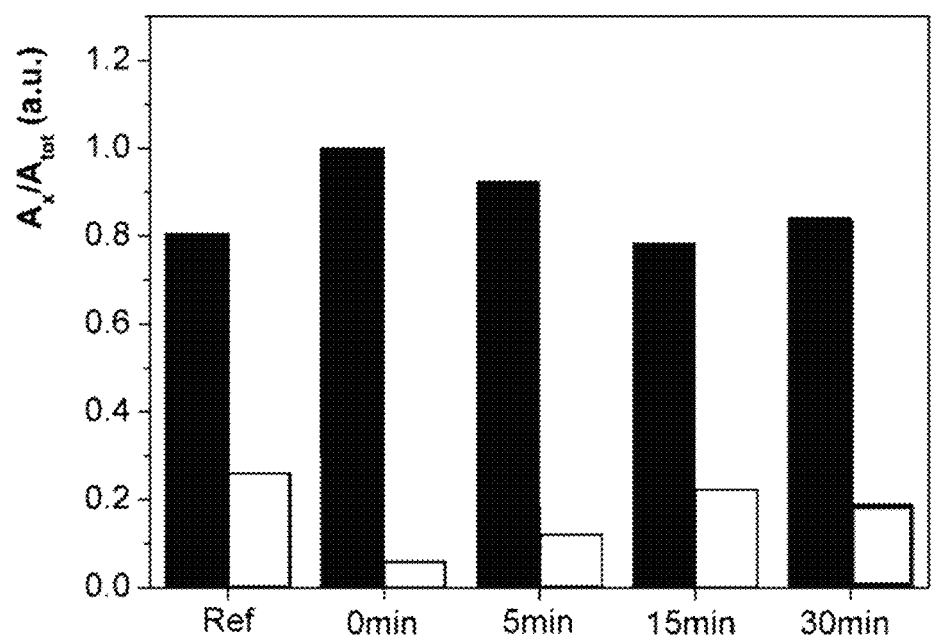
FIG. 8 shows the lifetime contribution of defect recombination or bandgap emission for a bare InP substrate or for embodiments of the present disclosure at different exposure times to $(NH_4)_2S$ vapour.

FIG. 7 shows decay curves for the InP/$Gd_{1.4}Al_{0.6}O_3$ stack for 0 min, 5 min and 15 min vapor exposure. The lifetime of the minority charge carriers is enhanced when the interface is exposed to sulphur containing compound. From the decay curves, the lifetime of the defect recombination and the bandgap emission was extracted and the relative contributions are plotted in FIG. 8. A bare InP substrate is shown as a reference. After deposition of a 4 nm $Gd_{1.4}Al_{0.6}O_3$ layer on the oxide free InP substrate (0 min), bandgap emission (white) is reduced and is accompanied by an increase in defect recombination (black). This explains the strong decrease in PL intensity as shown in FIG. 5. The interface quality can be significantly improved by exposure to a sulphur-containing compound; the increase in bandgap emission with increasing $(NH_4)_2S$ vapor exposure time was accompanied by a decrease in defect recombination. The trend is comparable to the PL spectra shown in FIG. 5.

Figure 9:
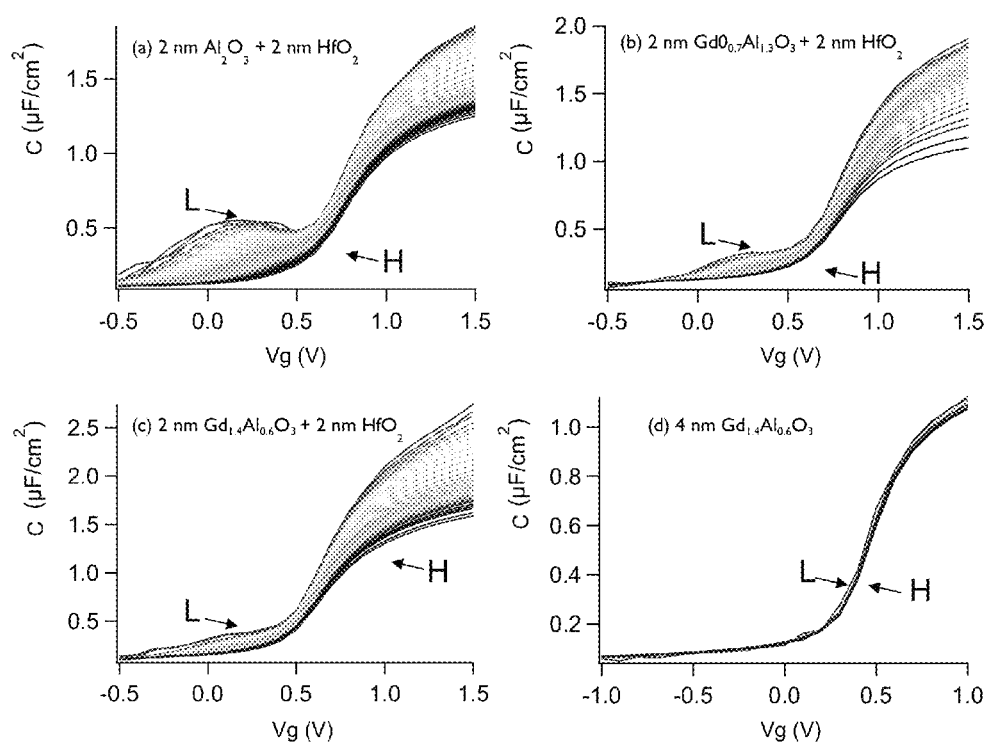
FIG. 9 shows the capacitance as a function of the gate voltage and the frequency for embodiments of the present disclosure.

The impact of Gd content on the electrical properties is shown in FIG. 9 (a-c) for S-passivated n-type InP (5 minutes immersion in $(NH_4)_2S$ solution after 5 minutes native oxide removal in 2M HCl). The capacitance is shown as a function of potential for different frequencies. L stands for low frequency (100 Hz) and H stands for high frequency (1 MHz). The large frequency dispersion in the lower potential range decreases with increasing Gd content. This can be attributed to a decrease in (mid-gap) interface trap density. No clear dependency is observed for the frequency dispersion at larger potentials (e.g., the border trap density is not affected). The interface defect density can be further decreased when the n-type InP wafer is exposed for 15 minutes to $(NH_4)_2S$ vapour instead of $(NH_4)_2S$ solution (see FIG. 9 where the frequency dispersion is drastically reduced (FIG. 9d). Interface defect density values as low as ~1E11 have been observed for the InP/$Gd_{1.4}Al_{0.6}O_3$ semiconductor structure 1, which are up to 1 order of magnitude lower than those obtained with immersion in a $(NH_4)_2S$ solution. Also, the border trap density is reduced for the vapor-based treatment. An InP/4 nm $Gd_{1.4}Al_{0.6}O_3$ structure wherein the InP was immersed for 15 min in $(NH_4)_2S$ solution (20 wt %) (not shown) showed worst results. A InP/2 nm $Gd_{1.4}Al_{0.6}O_3$ structure wherein the InP was exposed for 15 minutes to $(NH_4)_2S$ vapour showed better photoluminescence (not shown) than the corresponding 4 nm sample but its electrical characteristics could not be measured.

Figure 10:
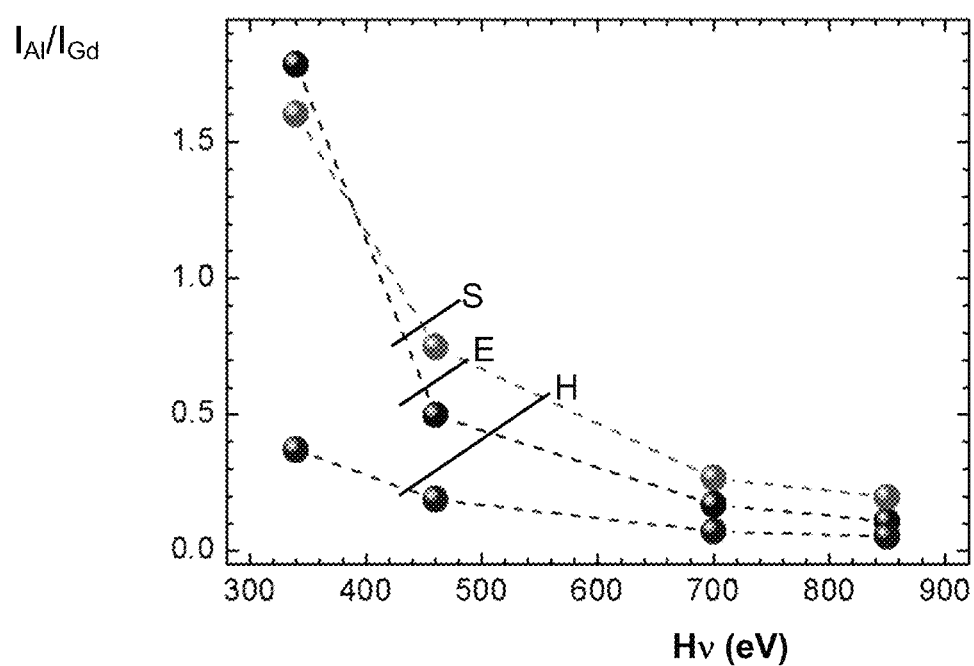
FIG. 10 shows the normalized Al/Gd synchrotron emission ratio as a function of the photon energy for an embodiment of the present disclosure and for simulations.

Example 5: Chemical Characterization of a Semiconductor Structure with a 15 Min $(NH_4)_2S$ Treatment According to an Embodiment of the Present Disclosure Synchrotron emission studies performed on a semiconductor structure 1 comprising a InP substrate 2 treated for 15 min with $(NH_4)_2S$ vapour and overlaid with 3 nm $GdAlO_3$ layer 3 in a manner analogous to Example 1, wherein alternating Gd cycle (a) and Al cycle (b) are used, reveal that Al is preferentially at the surface of the interfacial layer and Gd preferentially at the interface with the substrate (see FIG. 10). In FIG. 10, the normalized Al (2p)/Gd (4d) intensity ratio as a function of photon energy is shown. Further, in FIG. 10, H is a curve corresponding to a simulation assuming a homogeneous distribution of aluminium across the 3 nm thickness of the high-k interfacial layer 3; S is a curve corresponding to a simulation assuming a non-homogeneous distribution of Aluminium across the 3 nm thickness of the high-k interfacial layer 3, with Aluminium being concentrated in the top 2 nm of the high-k interfacial layer 3 and absent from the first nm of the high-k interfacial layer 3; the E curve is the experimental curve which behaves similarly to curve S and suggests that the interface (bottom surface of interfacial layer 3) is lower in Aluminium compared with the top surface of the high-k interfacial layer 3.

Example 6: Electrical Characterization of a Semiconductor Structures 1 Comprising an InP Substrate 2

In one example, a 2-inch InP substrate 2 was dipped in a 2M HCl solution for 5 minutes in order to remove its native oxide top layer. It was then immersed in a 20 wt % aqueous solution of $(NH_4)_2S$ for 5 minutes. The substrate 2 was then directly transferred into the load lock of an ALD tool, the pressure was decreased from atmospheric pressure to a few torr, and then it was backfilled with $N_2$ until atmospheric pressure. The substrate was then transferred from the load lock to the ALD chamber. The pressure of the ALD chamber was about 3 Torr. A $Gd_xAl_yO_3$ layer 3 (samples B and C) or a $Al_2O_3$ layer (sample A) was then deposited at 250° C. by the method of example 1.

Sample A (comparative) was obtained by performing first a cycle (z), followed by enough cycles (b) to obtain a $Al_2O_3$ layer of 2 nm thickness, and followed by the ALD deposition of a 2 nm $HfO_2$ on top of the $Al_2O_3$.

Sample B was obtained by performing first a cycle (z), followed by alternating Gd cycle (a) and Al cycle (b) until a layer of composition $Gd_{0.7}Al_{1.3}O_3$ is obtained with a thickness of 2 nm, and followed by the ALD deposition of a 2 nm $HfO_2$ on top of the $Gd_{0.7}Al_{1.3}O_3$.

Sample C was obtained by performing first a cycle (z), followed by a number of supercycles, wherein each supercycle comprises four Gd cycles (a) and one Al cycle (b). The number of supercycles was adapted to reach a layer of composition $G_{1.4}Al_{0.6}O_3$ having a thickness of 2 nm. This was followed by the ALD deposition of a 2 nm $HfO_2$ on top of the $G_{1.4}Al_{0.6}O_3$.

After the ALD deposition, the samples were transferred in an anneal oven and an annealing step was performed for 5 minutes at 400° C. in a 10% $H_2$ atmosphere.

Figure 2:
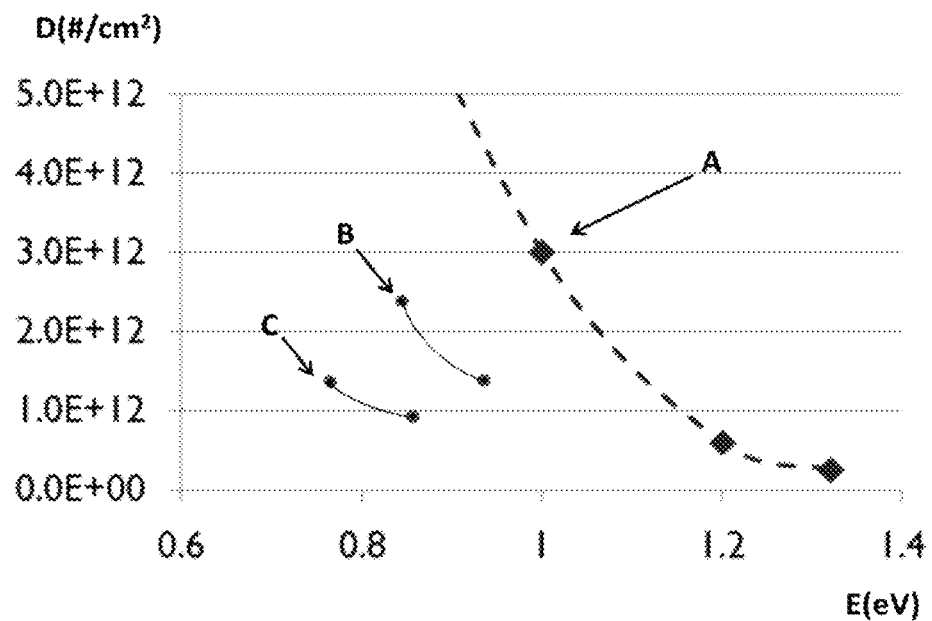
FIG. 2 is a graph of the defect density versus the energy from the InP valence band edge for semiconductor structures according to embodiments of the present disclosure and for a comparative semiconductor structure.

The electrical characterization of the samples A, B and C was then performed by a HP4156C parameter analyzer (see FIG. 2). The capacitance and parallel conductance were measured for a range of frequencies (between 100 Hz and 1 MHz). Scanning from room temperature to liquid nitrogen temperatures allowed extracting the distribution of the density of defects at the interface (D, Y-axis) as a function of the bandgap energy of the materials (the X-axis is the energy from the InP valence band edge (eV)). For this purpose the conductance method was used. D(E) should typically be evaluated across the device operation range—upper half of the bandgap for a n-FET and lower half of the bandgap for a p-FET. In the present case, the D(E) was evaluated across the upper half of the bandgap. The mid-gap Dit values (the values measure at the lowest E value in FIG. 2) dropped significantly going from A to C while the near-conduction band Dit values of B and C (the values measured at the highest E value in FIG. 2) are getting too low to be extracted accurately (~1E11) and were not plotted. The results show significant improvement for samples B and C when compared with the $Al_2O_3$ gate stack (A) and the defect density (D) values were below 1E12 towards the conduction bands (see FIG. 2).

Example 7: Electrical Characterization of a Semiconductor Structure 1 Comprising an InGaAs Substrate 2

In one example, a 2-inch InGaAs substrate 2 grown by CVD was dipped in a 2M HCl solution for 5 minutes in order to remove its native oxide top layer. It was then immersed in a 20 wt % aqueous solution of $(NH_4)_2S$ for 5 minutes. The substrate 2 was then directly transferred into the load lock of an ALD tool, the pressure was decreased from atmospheric pressure to a few torr, and then it was backfilled with $N_2$ until atmospheric pressure. The substrate was then transferred from the load lock to the ALD chamber. The pressure of the ALD chamber was about 3 Torr. A $GdAlO_3$ layer 3 or an $Al_2O_3$ layer was then deposited at 250° C. by the ALD method of example 1.

The $Al_2O_3$ layer was obtained by performing first a cycle (z), followed by enough cycles (b) to obtain a $Al_2O_3$ layer of 2 nm thickness, and followed by the ALD deposition of a 2 nm $HfO_2$ on top of the $Al_2O_3$.

The $GdAlO_3$ layer 3 was obtained by performing first a cycle (z), followed by an equal number of Gadolinium (a) and Aluminium (b) cycles.

After the ALD deposition, the samples were transferred in an anneal oven and an annealing step was performed for 5 minutes at 400° C. in a 10% $H_2$ atmosphere.

Figure 3:
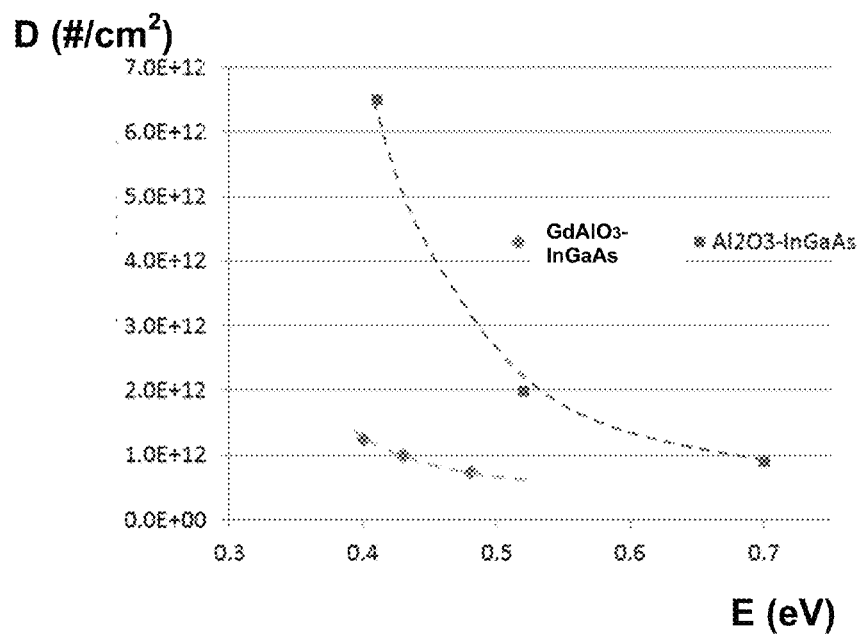
FIG. 3 is a graph of the defect density versus the energy from the InGaAs valence band edge for a semiconductor structure according to an embodiment of the present disclosure and for a comparative semiconductor structure.

The electrical characterization of the $Al_2O_3$ and $GdAlO_3$ samples was then performed by a HP4156C parameter analyzer. The capacitance and parallel conductance were measured at for a range of frequencies (between 100 Hz and 1 MHz). Scanning from room temperature to liquid nitrogen temperatures allowed extracting the distribution of Dit as a function of the bandgap energy of the materials. For this purpose the conductance method was used. The results show significant improvement for $GdAlO_3$ when compared with the $Al_2O_3$ gate stack and the interface defect density (Dit) values were below 1E12 towards the conduction bands (see FIG. 3).

It is to be understood that although various embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Method elements may be added or deleted to methods described within the scope of the present disclosure.

What is claimed is:

1. A semiconductor structure comprising:
   a substrate comprising a III-V material; and
   a high-k interfacial layer overlaying the substrate, wherein the interfacial layer comprises a rare earth aluminate, and wherein the high-k interfacial layer has a top surface facing away from the substrate and a bottom surface facing toward the substrate, and wherein an aluminium content at the top surface is higher than at the bottom surface.

2. The semiconductor structure of claim 1, further comprising a high-k dielectric layer overlying the interfacial layer.

3. The semiconductor structure of claim 2, wherein an equivalent oxide thickness of the stack of the high-k interfacial layer and the high-k dielectric layer is below 1 nm.

4. The semiconductor structure of claim 3, wherein the high-k interfacial layer comprises $Gd_xAl_yO_3$, and wherein x is at most 1.0.

5. The semiconductor structure of claim 3, wherein the high-k interfacial layer comprises $Sc_xAl_yO_3$, and wherein y is at least 0.5.

6. The semiconductor structure of claim 2, wherein the high-k dielectric layer includes one or more of $HfO_2$, $TiO_2$, or $ZnO_2$.

7. The semiconductor structure of claim 2, wherein the thickness of the high-k dielectric layer is from 0.5 to 2 nm.

8. The semiconductor structure of claim 2, wherein a leakage current below 0.01 A/cm$^2$ is achieved at 1V.

9. The semiconductor structure of claim 1, wherein the rare earth aluminate includes one or more of $Gd_xAl_yO_3$, $Sc_xAl_yO_3$, or $La_xAl_yO_3$, wherein x is from 0.4 to 1.6, and wherein x+y=2.

10. The semiconductor structure of claim 9, wherein x is from 0.4 to 1.5, and wherein x+y=2.

11. The semiconductor structure of claim 10, wherein x is from 0.4 to 1.4, and wherein x+y=2.

12. The semiconductor structure of claim 1, wherein the III-V material includes one or more of InP, $In_zGa_{1-z}As$, or $Al_zGa_{1-z}As$, and wherein z is from 0 to 1.

13. The semiconductor structure of claim 1, wherein the thickness of the high-k interfacial layer is from 0.5 to 2 nm.

14. The semiconductor structure of claim 1, wherein a sulphur-comprising compound is present at the interface between the substrate and the high-k interfacial layer.

15. An n-type FET device comprising a semiconductor structure according to claim 1.

16. A method for manufacturing a semiconductor structure according to claim 1 comprising:

providing a substrate comprising a III-V material; and depositing a high-k interfacial layer overlaying the substrate, wherein the interfacial layer comprises a rare earth aluminate, wherein the high-k interfacial layer has a top surface facing away from the substrate and a bottom surface facing toward the substrate, and wherein an aluminium content at the top surface is higher than at the bottom surface.

17. The semiconductor structure of claim 1, wherein an interface between the substrate and the high-k interfacial layer has an interface defect density between $5*10^{10}$ to $5*10^{12}$ defects/cm$^2$ when measured at at least one energy level within a bandgap of the III-V material.

* * * * *